(12) United States Patent
Prikhodko et al.

(10) Patent No.: US 7,274,206 B2
(45) Date of Patent: Sep. 25, 2007

(54) OUTPUT POWER DETECTION CIRCUIT

(75) Inventors: Dmitry Pavlovich Prikhodko, Nijmegen (NL); Adrianus Van Bezooijen, Nijmegen (NL); Christophe Chanlo, Nijmegen (NL); John Joseph Hug, Nijmegen (NL); Ronald Koster, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/560,638

(22) PCT Filed: Jun. 15, 2004

(86) PCT No.: PCT/IB2004/050902

§ 371 (c)(1),
(2), (4) Date: Dec. 13, 2005

(87) PCT Pub. No.: WO2004/112239

PCT Pub. Date: Dec. 23, 2004

(65) Prior Publication Data
US 2006/0186964 A1    Aug. 24, 2006

(30) Foreign Application Priority Data
Jun. 18, 2003   (EP)   .................................. 03101789

(51) Int. Cl.
G01R 31/26   (2006.01)

(52) U.S. Cl. .......................... 324/768; 324/142; 324/95
(58) Field of Classification Search .................. 324/95, 324/168, 142, 769, 768; 330/140, 277
See application file for complete search history.

(56) References Cited

U.S. PATENT DOCUMENTS

| 5,659,253 | A | 8/1997 | Busking |
| 6,448,855 | B1 | 9/2002 | Sowlati et al. |
| 6,528,983 | B1* | 3/2003 | Augustine .................... 324/95 |
| 6,545,539 | B1 | 4/2003 | Prikhodko et al. |
| 6,753,734 | B2* | 6/2004 | Arell et al. ................. 330/296 |
| 6,990,323 | B2* | 1/2006 | Prikhodko et al. .......... 455/126 |

* cited by examiner

*Primary Examiner*—Ha Tran Nguyen
*Assistant Examiner*—Arleen M. Vazquez
(74) *Attorney, Agent, or Firm*—Peter Zawilski

(57) ABSTRACT

A detection circuit for detecting the output power of a power amplifier comprises a first current minor transistor (Ti 1) having a base, which is connectable to a power transistor (T10), and a collector, a RF detection means (RF-det) for detecting the RF current flowing through the current mirror transistor (T11). Said RF detection means (RFdet) is connected to the collector of said first current mirror transistor (T11). Said detection circuit further comprises a biasing means (bias-RF-det) for biasing said RF detection means (RF-det), wherein said biasing means is connected to said collector of said first current mirror (T11) and said RF detection means (RF-det).

5 Claims, 17 Drawing Sheets

OUTPUT POWER DETECTION CIRCUIT

The invention relates to a power detection circuit for detecting the output power of a power amplifier.

Power amplifiers are frequently used in high-frequency RF amplifiers, such as those used in wireless communications apparatus, as well as in audio amplifiers and other applications. In these amplifiers, especially in RF applications, it is desirable to provide an indication of the power in the output stage.

This is typically accomplished by one of three techniques. First, a directional coupler or voltage divider may be provided at the output of the power amplifier to sense a fraction of the signal applied to the load, and this sample signal is then used to indicate the power in the load. The second technique generates a sample of the current in the power amplifier by using mirror transistor based on the detection of average power and the third technique uses a mirror transistor based on the detection of RF power.

However, directional couplers are bulky and lossy, and according to U.S. Pat. No. 5,659,253 a peak diode detector needs a reference diode or switching capacitance technique to compensate for dc offset. Besides, the dynamic range of the diode detector is limited and known technique for dynamic range extension by compression is based on a log amplifier, which makes the circuitry more complicated and requires higher current consumption, which is not desirable especially for mobile applications.

Power detection according to the second technique, i.e. with a mirror transistor for average power detection is suitable for high-efficient class AB amplifier, which are used for GSM mobile phones, but not anymore for linear class A amplifiers or highly biased class-A/B amplifiers, which are used in Edge or W—CDMA based mobile phones.

U.S. Pat. No. 6,448,855 describes a configuration based on RF detection, which is suitable for class A amplifiers but require p-type devices, like PMOS, which are not always available in RF technologies based on GaAs. The particular amplifiers also use average detection and square law devices causing signal expansion in the detector circuitry has no DC cancellation. These are disadvantages in that the sensitivity and dynamic range is reduced.

Furthermore, power detection with a mirror transistor for average power is not suitable for class A or highly biased class AB amplifier, mainly because of two disadvantages. The sensitivity depends on the biasing level, i.e. the higher the biasing level the less the sensitivity, and moreover, the accuracy at lower power levels depends on the accuracy of the biasing current.

Thus, the power detector solution for class A-AB power amplifiers with high sensitivity and relatively low absolute value of the detected signal is required.

For example mobile phones based on GSM or Edge need accurate power control over a wide dynamic range. A conventional power control circuit with a current mirror based power detector circuits is described in U.S. Pat. No. 6,545,539. The output power, represented by a detected current, is compared to a reference current that is derived from a base-band signal. The amplified and integrated error signal is fed to a cascaded variable gain amplifier stages to set the output power accurately. However, in order to improve the performance of the power control, it is desirable to improve its sensitivity over a wide dynamic range.

It is therefore an object of the invention to provide an improved detection circuit for detecting the output power of a power amplifier with increased sensitivity over a wide dynamic range.

This object is solved by a detection circuit for detecting the output power of a power amplifier according to claim 1.

Therefore, a detection circuit for detecting the output power of a power amplifier comprises a first current mirror transistor T11 having a base, which is connectable to a power transistor T10, and a collector, a RF detection means RF-det for detecting the RF current flowing through the current mirror transistor T11. Said RF detection means RF-det is connected to the collector of said first current mirror transistor T11. Said detection circuit further comprises a biasing means bias-RF-det for biasing said RF detection means RF-det, wherein said biasing means is connected to said collector of said first current mirror T11 and said RF detection means RF-det.

Further aspects of the invention are described in the dependent claims.

These and other aspects of the invention are apparent from and will be elucidated with reference to the embodiment(s) described hereinafter.

Figure 1:
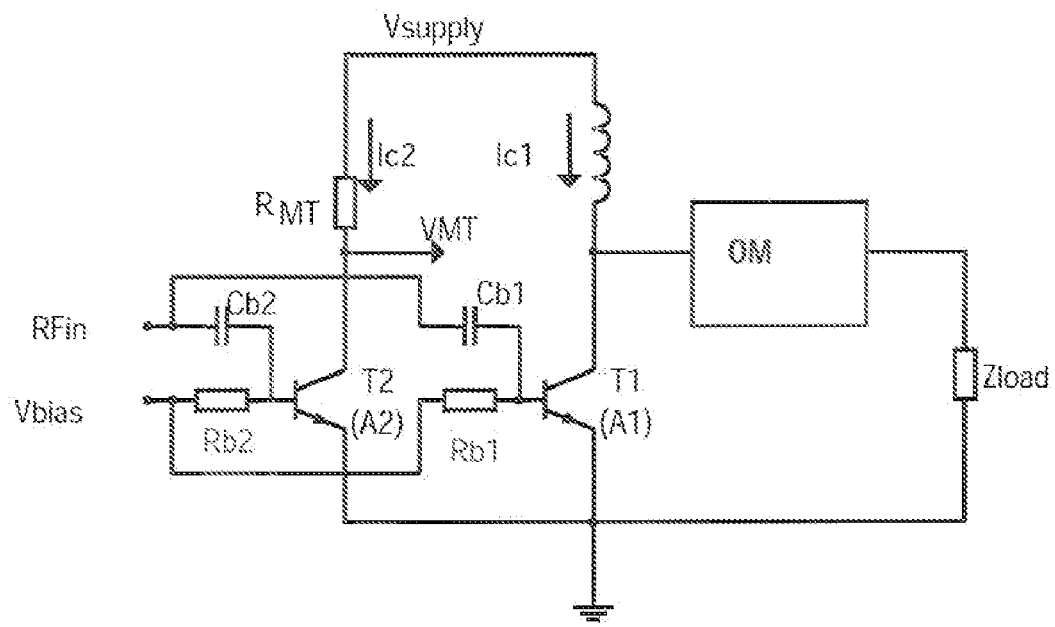
FIG. 1 shows a power detection circuit based on mirror transistors.

FIG. 1 shows a power detection circuit based on mirror transistors. The detection circuit comprises mirror transistors T1 and T2 with areas A1 and A2, respectively, wherein the transistor T1 represents a power transistor and the mirror transistor T2 is used to detect the current flowing in T1. The base of transistor T2 is coupled to a bias voltage $V_{bias}$ via a resistor $R_{b2}$ and to a RF input $RF_{in}$ via a capacitor $C_{b2}$. Likewise is the base of transistor T1 coupled to a bias voltage $V_{bias}$ via a resistor $R_{b1}$ and the RF input $RF_{in}$ via a capacitor $C_{b1}$. Therefore, the dc path is realized via the resistors $R_{b1}$, $R_{b2}$ and the RF path is realized via the capacitors $C_{b1}$, $C_{b2}$. A load $z_{load}$ is coupled to the transistor T1 via an output matching circuit OM. The collector of the current mirror transistor T2 supplies the detected voltage $V_{MT}$.

However, power detection with a mirror transistor for average power as shown in FIG. 1 is not suitable for class A or highly biased class AB amplifier. It has two disadvantages, namely the sensitivity depends on the biasing level, i.e. the higher the biasing level the less the sensitivity. Furthermore, the accuracy at lower power levels depends on the accuracy of the biasing current.

Figure 2:
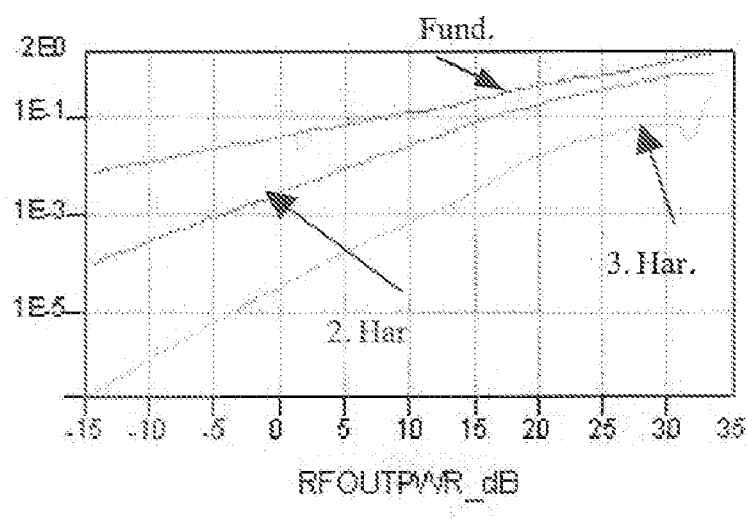
FIG. 2 shows the result of an examination of the waveform and harmonic content of the mirror transistor T2 collector voltage VMT.

FIG. 2 shows the result of an examination of the waveform and harmonic content of the mirror transistor T2 collector voltage VMT. It can be seen that the content of the second and third harmonics (2. Har., 3. Har.) is much lower than the content of the fundamental. Therefore, it can be assumed that this voltage represents a good indication of the fundamental output power.

The detection voltage VMT corresponds to:

$$V_{MT} = V_{SUP} - I_{C2\_DC}R_{MT} - I_{C2\_PEAK}R_{MT} = V_{SUP} - \frac{I_{C1\_DC}}{N}R_{MT} - \frac{I_{C1\_PEAK}}{N}R_{MT},$$

where $I_{C1\_DC}$, $I_{C2\_DC}$—biasing currents of the power transistor T1 and accordingly mirror transistor T2.

$I_{C1\_PEAK}$, $I_{C2\_PEAK}$—peak currents of the power transistor T1 and accordingly mirror transistor T2.

$$N = \frac{A_1}{A_2}$$

ratio of the power transistor emitter area $A_1$ and mirror transistor emitter area $A_2$. Accordingly, the voltage VMT is dependent on the peak current of the power transistor T1.

An important aspect of the detector performance is the temperature and supply voltage stability of the detected voltage as a function of the output power. It can be shown, that the use of peak detection of the voltage VMT is a good and accurate indication of the output power.

The power detection can be performed in two ways, namely ac coupled with further detection of the positive peak or a dc coupled detection of the negative peak.

Figure 3:
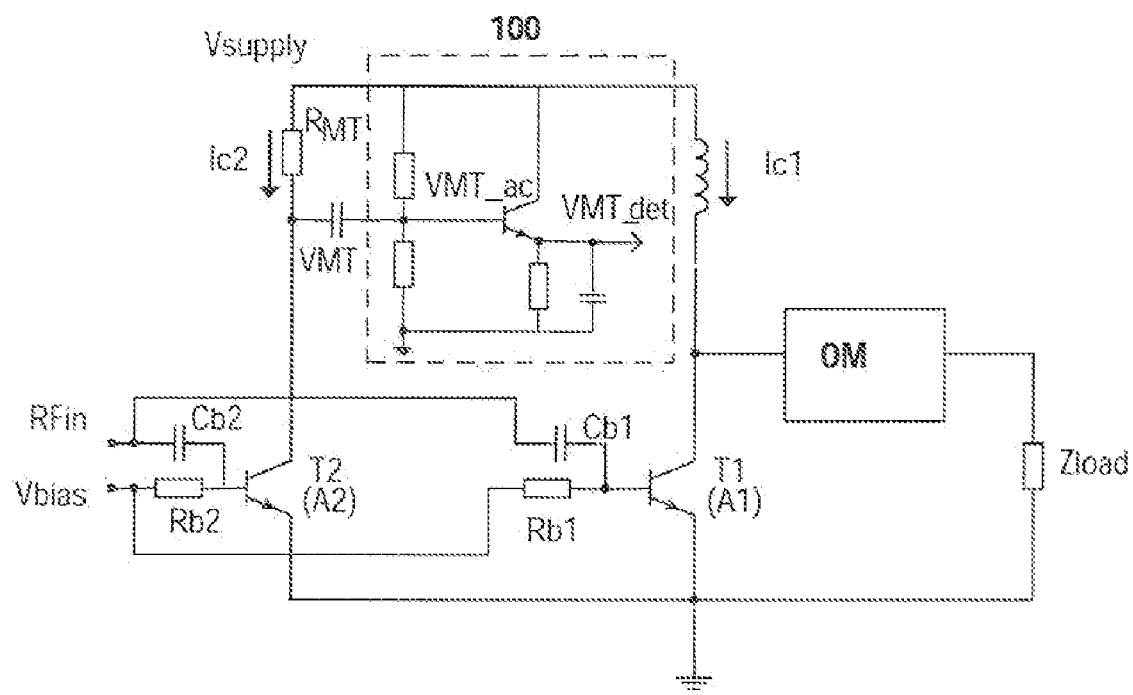
FIG. 3 shows a power detection circuit based on an AC coupled detection.
Figure 4:
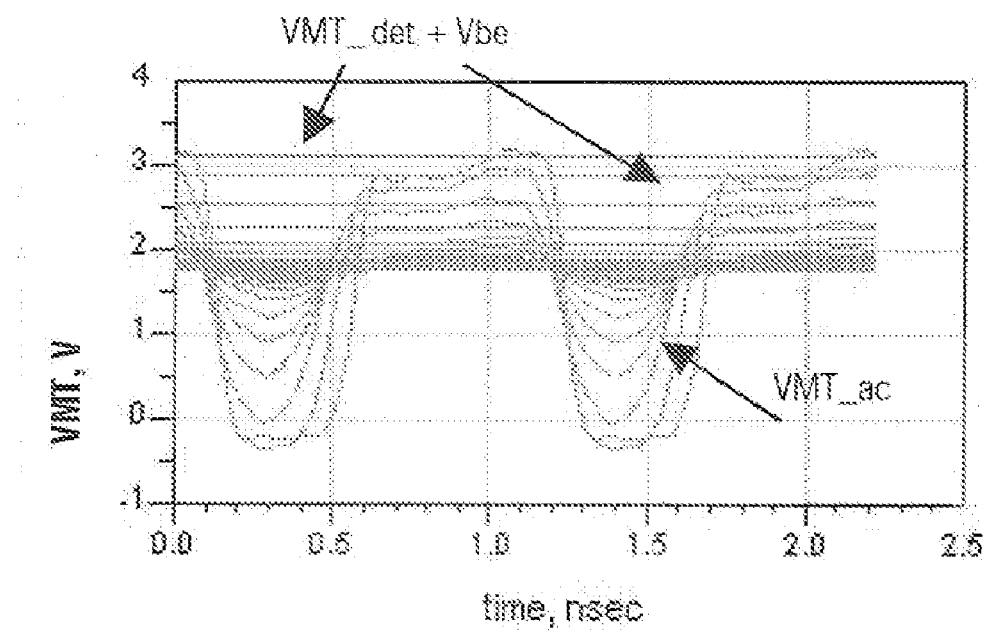
FIG. 4 shows the detected voltage VMT_det with a $V_{be}$ offset and the AC coupled voltage $V_{MT\text{-}ac}$ in the time domain.
Figure 5:
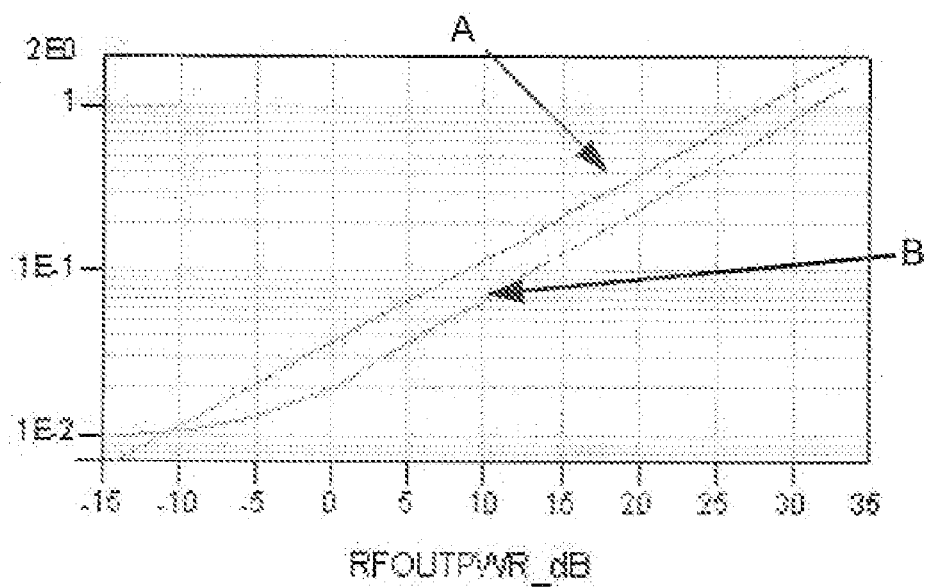
FIG. 5 shows the detected voltage VMT_det with dc offset cancellation versus the output power.

FIG. 3 shows a power detection circuit based on an AC coupled detection. This detection circuit is based on the detection circuit according to FIG. 1. The current mirror with the transistors T1 and T2 as well as the coupling to the AC path via the capacitors $C_{b1}$, $C_{b2}$ and the dc path via the resistors $R_{b1}$, $R_{b2}$ corresponds to the circuit in FIG. 1. The only difference is a detector circuit 100 and a capacitor $C_{VMT}$ for coupling the collector of transistor T2 with the detector circuit 100. The detector circuit 100 comprises a transistor with its collector coupled to the supply voltage $V_{supply}$ and its emitter coupled to ground via a resistor and a capacitor and furthermore supplies a voltage VMT_det. However, the main disadvantage of this detection is a strong distortion of the AC decoupled voltage (VMT_ac) compared to RF voltage at the collector of the mirror transistor (VMT). A strong distortion of the AC coupled voltage degrades the ratio between detected signal and output power. Another negative effect, namely the losses in the dynamic range of the AC coupled signal can clearly be seen in FIGS. 4 and 5. FIG. 4 shows the detected voltage VMT_det with a $V_{be}$ offset and the AC coupled voltage $V_{MT\text{-}ac}$ in the time domain. The $V_{be}$ offset is due to the voltage between the base and emitter of the transistor in the detector 100. FIG. 5 shows the detected voltage VMT_det with dc offset cancellation versus the output power. The curve A in FIG. 5 represents the voltage VMT and the curve B represents the detected voltage minus an offset voltage. However, there are losses present in the dynamic range between these two curves. The same effects are relevant to the negative detection of the ac coupled signal. Therefore, it appears apparent that positive or negative detection of the ac coupled signal is not the best option.

Figure 6:
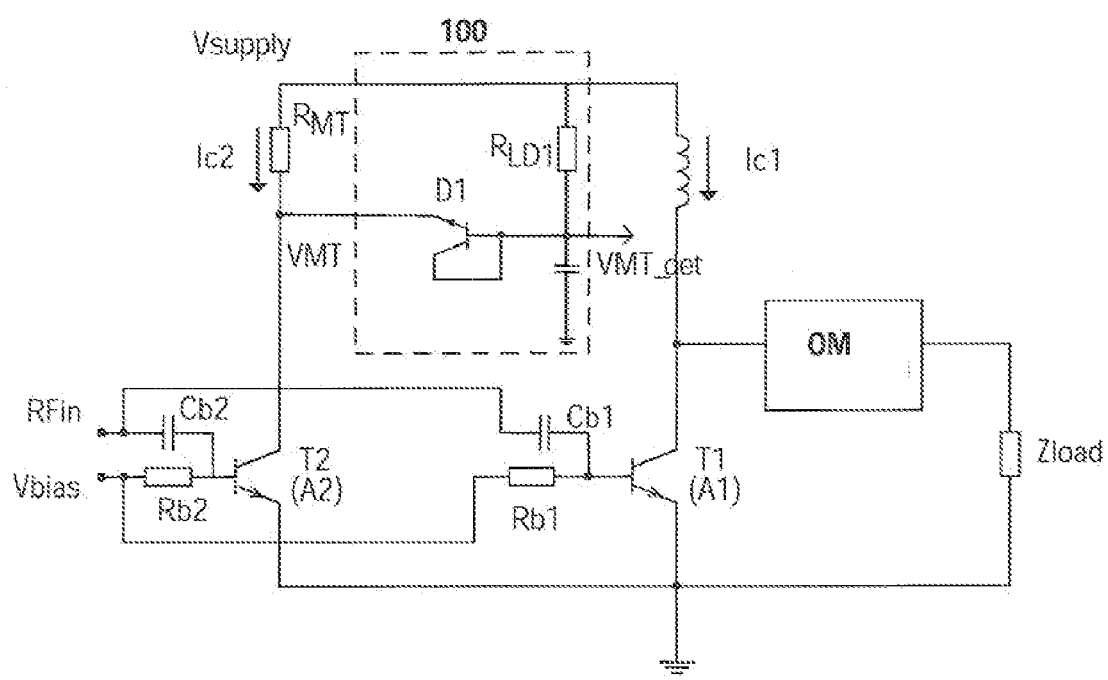
FIG. 6 shows a power detection circuit based on DC coupled detection of the negative peak according to a first embodiment of the invention.

FIG. 6 shows a power detection circuit based on DC coupled detection of the negative peak according to a first embodiment of the invention. This detection circuit is based on the detection circuit according to FIG. 1. The current mirror with the transistors T1 and T2 as well as the coupling to the AC path via the capacitors $C_{b1}$, $C_{b2}$ and the dc path via the resistors $R_{b1}$, $R_{b2}$ corresponds to the circuit in FIG. 1. The only difference is a detector circuit 110 comprising a transistor with its base and collector is coupled together, so that a diode connected transistor D1 is realized. The base/collector of this transistor is coupled to the supply voltage $V_{supply}$ via a resistor $R_{LD1}$ and to ground via a capacitor and supplies the detection voltage VMT_det.

Figure 7:
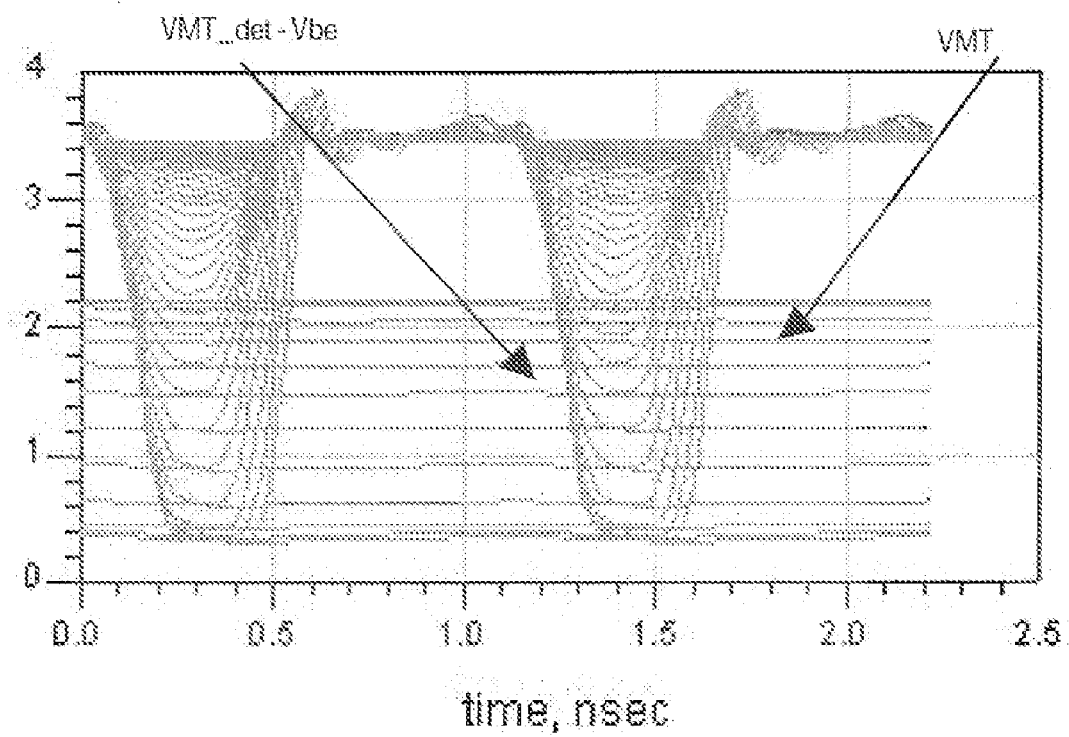
FIG. 7 shows the shape of voltage VMT as well as the shape of the detected voltage VMT_det with a $V_{be}$ offset in the time domain.
Figure 8:
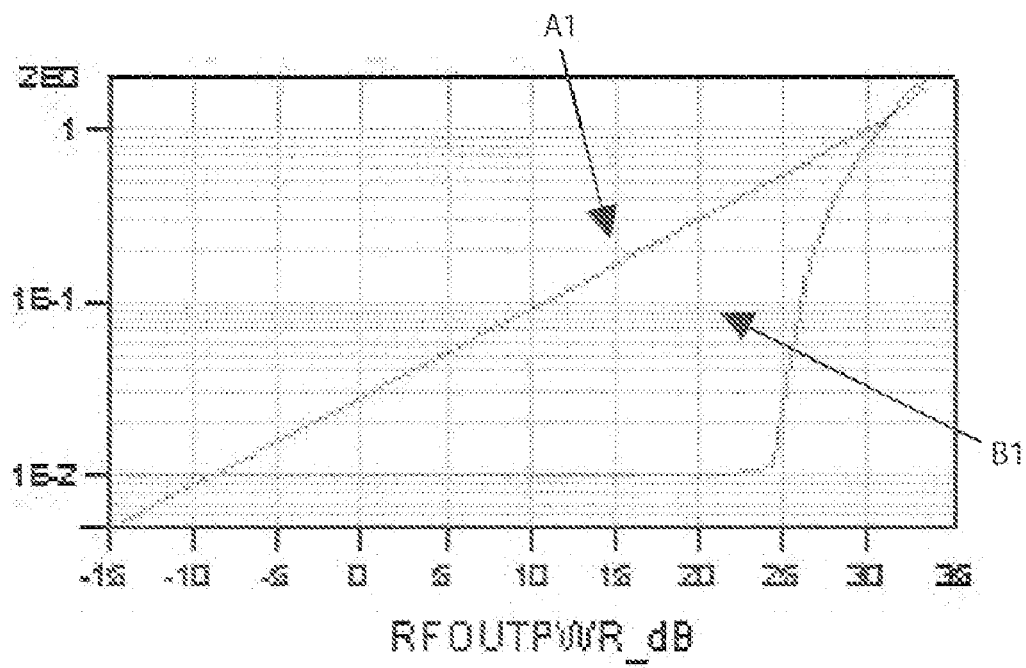
FIG. 8 shows the detected voltage with a dc offset cancellation versus output power.

FIG. 7 shows the shape of voltage VMT as well as the shape of the detected voltage VMT_det with a $V_{be}$ offset in the time domain. FIG. 8 shows the detected voltage with a dc offset cancellation versus output power. Curve A1 represents the voltage VMT and curve B1 represents the detected voltage with dc offset cancellation. As one can see, due to the Vbe diode threshold, i.e. the voltage between the base and the emitter, it is only possible to detect output power from 20 dBm, namely where the input RF peak is the value of Vbe lower than the supply voltage Vsupply. Therefore, this detector results in a low sensitivity.

Figure 9:
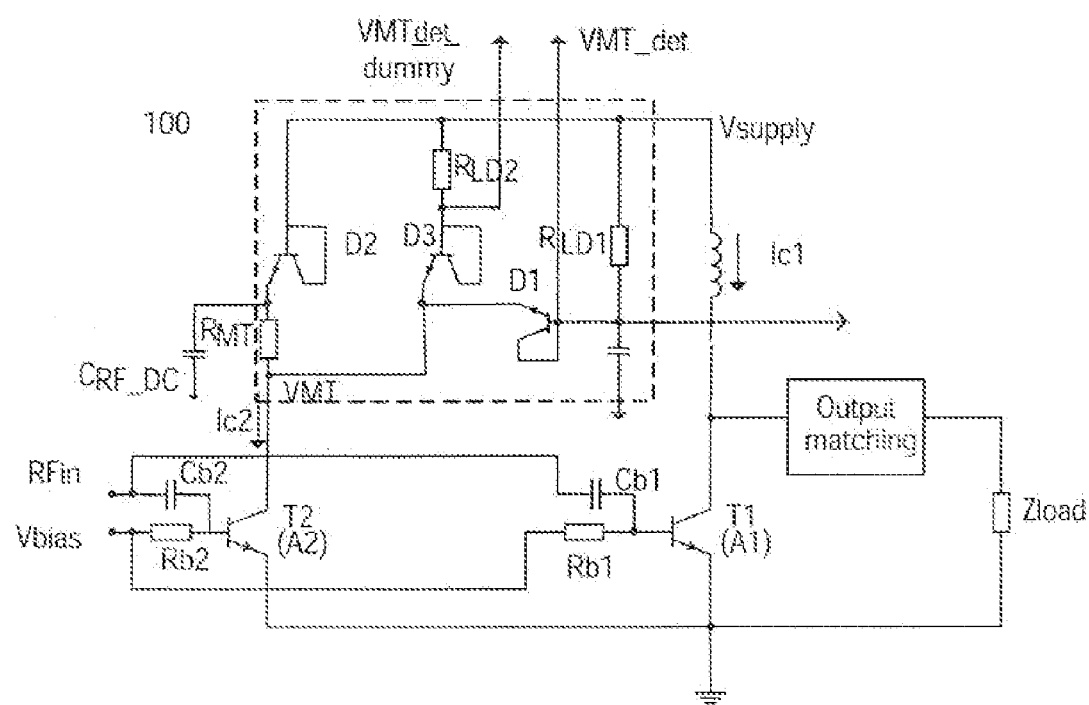
FIG. 9 shows a power detection circuit according to a second embodiment of the invention.

FIG. 9 shows a power detection circuit according to a second embodiment of the invention. This detector shows an improved biasing and therefore an increased sensitivity. The power detection circuit of the second embodiment is based on the detection circuit of FIG. 6. An additional diode connected transistor D2 is incorporated to pre-bias detector D1. The RF path $R_{MT}$ and dc path (via D2) are decoupled by the capacitance $C_{RF\_DC}$. Furthermore, a second diode connected transistor D3 is coupled to the supply voltage $V_{supply}$ via a resistor $R_{LD2}$ and the emitter of the diode connected transistor D1. The base of transistor D1 supplies the voltage VMT_det and the base of transistor D3 supplies the voltage VMT_det_dummy.

Figure 10:
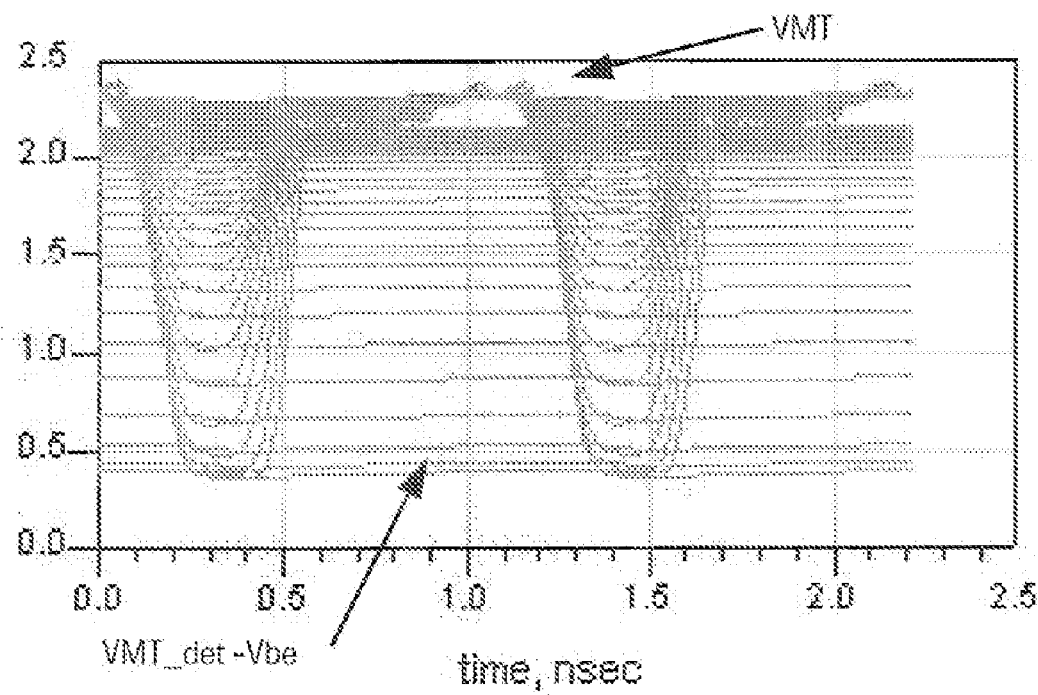
FIG. 10 shows the shape of voltage VMT as well as the shape of the detected voltage VMT_det with a $V_{be}$ offset according to the second embodiment in the time domain.
Figure 11:
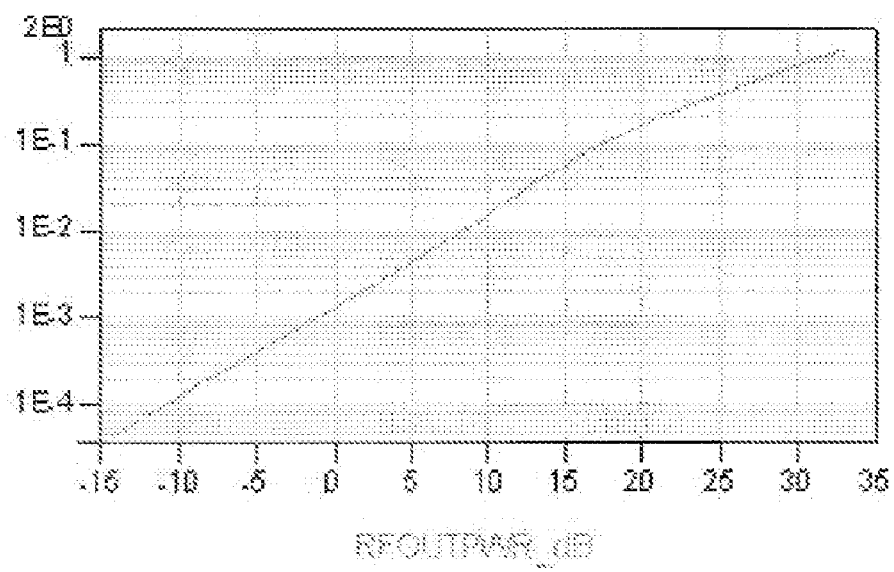
FIG. 11 shows the detected voltage with a de offset cancellation versus output power according to the second embodiment.
Figure 14:
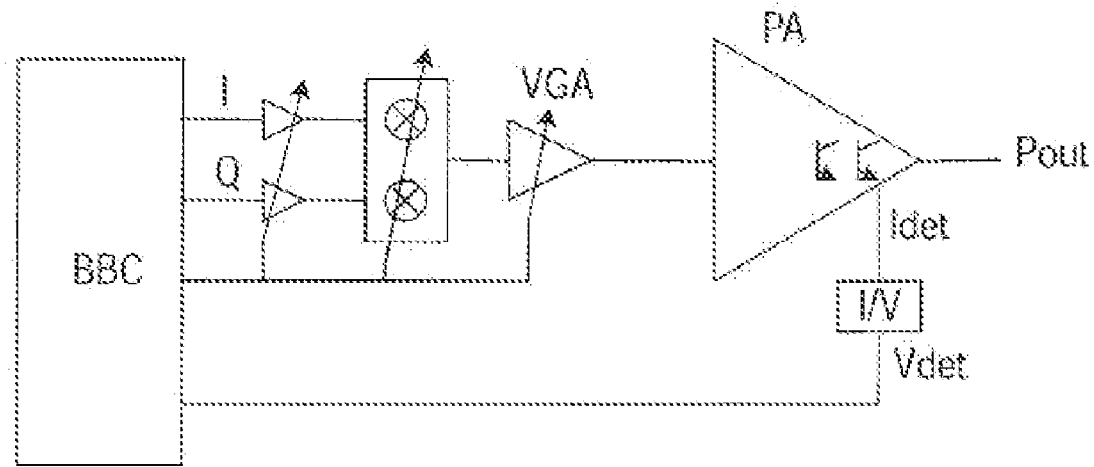
FIG. 14 shows an alternative power control concept via base-band with current mirror based power detector.

FIG. 10 shows the shape of voltage VMT as well as the shape of the detected voltage VMT_det with a $V_{be}$ offset according to the second embodiment in the time domain. FIG. 11 shows the detected voltage with a dc offset cancellation versus output power according to the second embodiment Since the offset between the curves of the voltage VMT and the detected voltage VMT_det with the offset is decreased compared to the offset in FIG. 7, the sensitivity is strongly increased for the lower power levels as shown in FIG. 14, i.e. output powers can be detected from approx –15 dBm.

Figure 12:
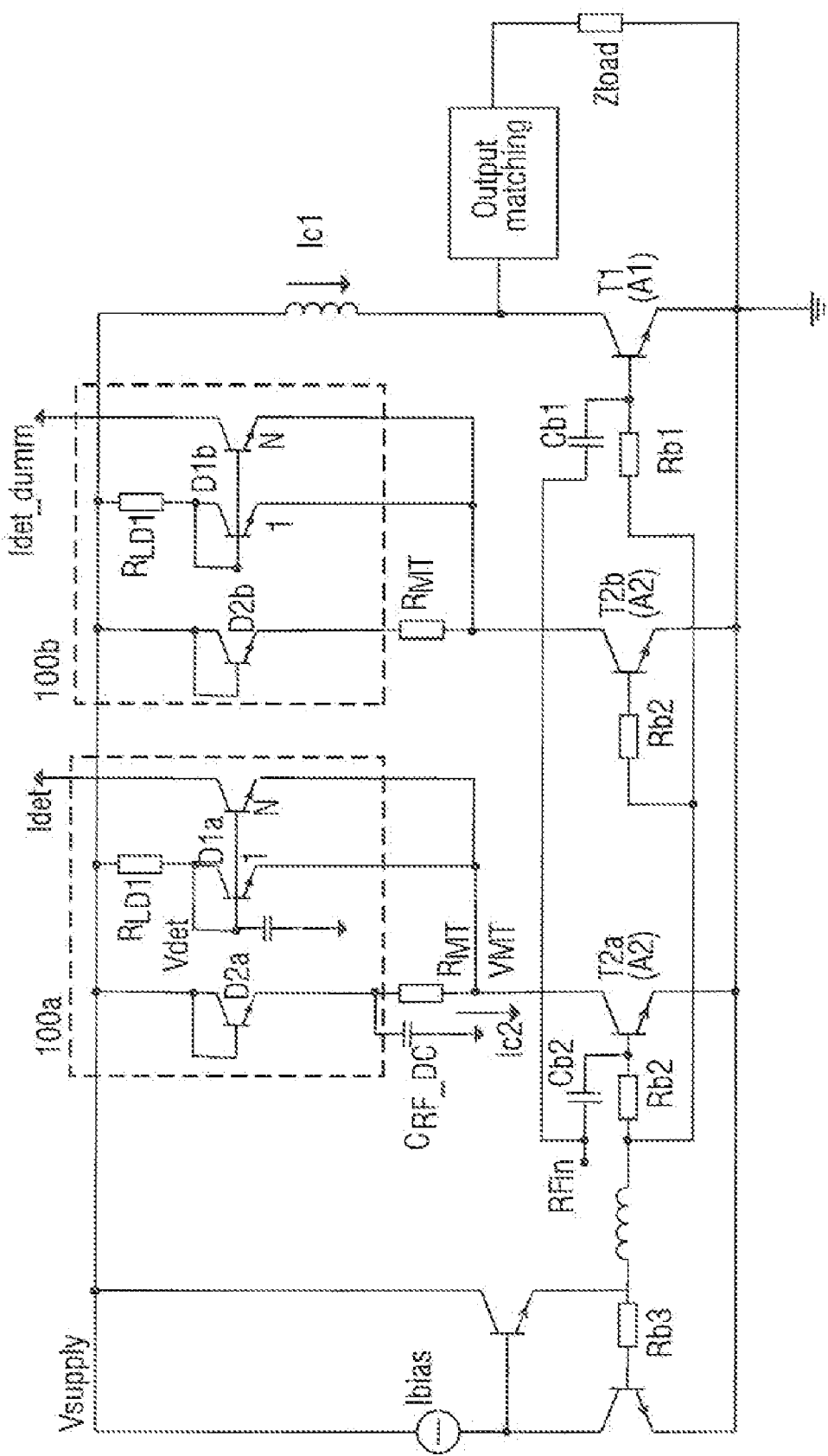
FIG. 12 shows a further power detection circuit according to a third embodiment.

FIG. 12 shows a further power detection circuit according to a third embodiment. This detection circuit is based on the detection circuit according to FIG. 9, with an additional dc cancellation. The transistor T2a corresponds to the transistor T2 in FIG. 12. An extra dummy transistor T2b with the same configuration at the collector as T2a has been added with only a dc path for biasing. The diode connected transistor D1a (D1b) is converted to the current mirror with the ratio N in order to have the current output instead of a voltage output as in the detection circuit according to FIG. 12. The collector of the current mirror transistor of the detector 100a supplies the detection current $I_{det}$ and the collector of the current mirror of the detector 100b supplies the detection current $I_{det\_dummy}$. These detectors can be implemented together with the RF-power transistor in Si as well as in GaAs technology because they make use of NPNs only.

Now we can write:

$$\Delta I_{det} = I_{det} - I_{det\_dummy} = I_q + \frac{V_{det}}{R_{LD1}}N - I_q = \frac{A_2}{A_1}\frac{R_{MT}}{R_{LD1}}NI_{C1},$$

where $I_q$ is a quiescent current. Accordingly, an accurate replica of the RF collector current of the power transistor T1 has been achieved.

Above, a new solution of the multi-technology power detector was presented. Two different concepts have been considered: ac and dc coupled peak detection. It was shown that dc coupled detection is preferable because it does not affect RF voltage. The implementation of a dc coupled power detector can be performed using only npn devices, allowing its use in a multi-technology power amplifier with a HBT output stage+BiCMOS MMIC.

When the detector circuits of the embodiments according to the invention are compared to the average current detector (current mirror) according to U.S. Pat. No. 6,545,539, sensitivity of the solution according to the invention does not depend on the quiescent current. The DC tracking is implemented on the same die and the DC cancellation and the square root function are performed in the MMIC (npn-pnp process). Compared to the square law function as described in U.S. Pat. No. 6,448,855, peak detection with square root function is significantly increasing the sensitivity for low output power levels and decreasing deviations for high output power levels. Temperature and Vsupply deviations do not seriously degrade its performance.

While the above section, i.e. FIG. 1 to 12, is dedicated to the detection of the output power of the power amplifier, the following section is related to the accurate control of the output power of a power amplifier.

Figure 13:
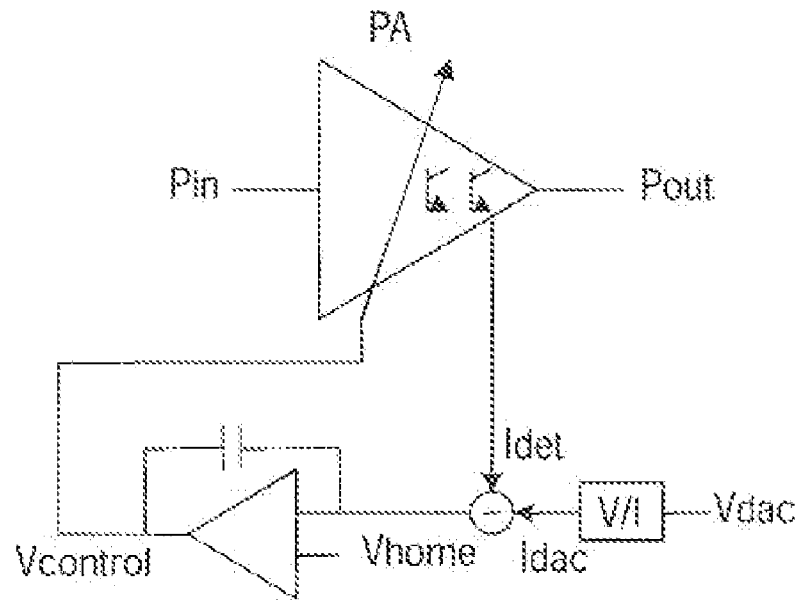
FIG. 13 shows a schematic block diagram of a power control circuit with a current mirror based power detection.

FIG. 13 shows a schematic block diagram of a power control circuit with a current mirror based power detection. Such a power control circuit is described in U.S. Pat. No. 6,545,539. The power control circuit comprises a power amplifier PA with $P_{in}$ as input and $P_{out}$ as output. The power amplifier PA comprises a power detection circuit with $I_{det}$ as output, i.e. the output power is represented by $I_{det}$. $I_{det}$ is compared to a reference current Idac that is derived from a base-band signal Vdac by means of a voltage-current converter V/I. The amplified and integrated error signal Vcontrol is fed to the cascaded variable gain amplifier stages to set the output power accurately.

FIG. 14 shows an alternative power control concept via base-band with current mirror based power detector. This concept is more suited for (linear) fixed gain power amplifiers. It makes use of a similar current mirror based power detector as the power amplifier of FIG. 22. The detected current $I_{det}$ is converted into a voltage which is fed to an D-to-A converter that is part of a base-band controller. The controller sets, partly by means of software, the gain of I/Q base-band signal path and/or the gain of RF-mixer/amplifier stages in front of the (fixed gain) power amplifier.

The power amplifier PA in FIGS. 13 and 14 may include a detection circuit according to FIG. 1, 3, or 6.

Figure 15:
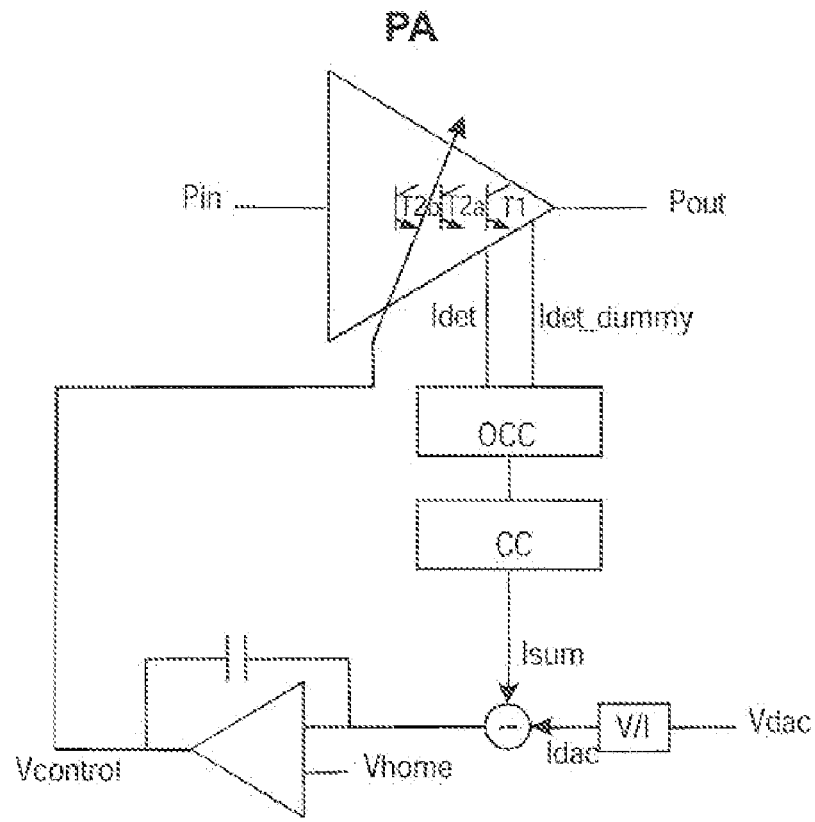
FIG. 15 shows a basic representation of a power amplifier with a power control loop according to a fourth embodiment of the invention.

FIG. 15 shows a basic representation of a power amplifier with a power control loop according to a fourth embodiment of the invention. This power control circuit is based on the circuit according to FIG. 13. Additionally, an offset compensation circuit OCC and a compression circuit CC is included into the power control loop. These two circuits form an interface circuit which can be implemented in a silicon BiCMOS process while the power amplifier can be implemented in a GaAs process. The offset compensation circuit OCC can be embodied by a dc cancellation circuit and the compression circuit CC can be embodied by a square root function circuit.

Figure 16:
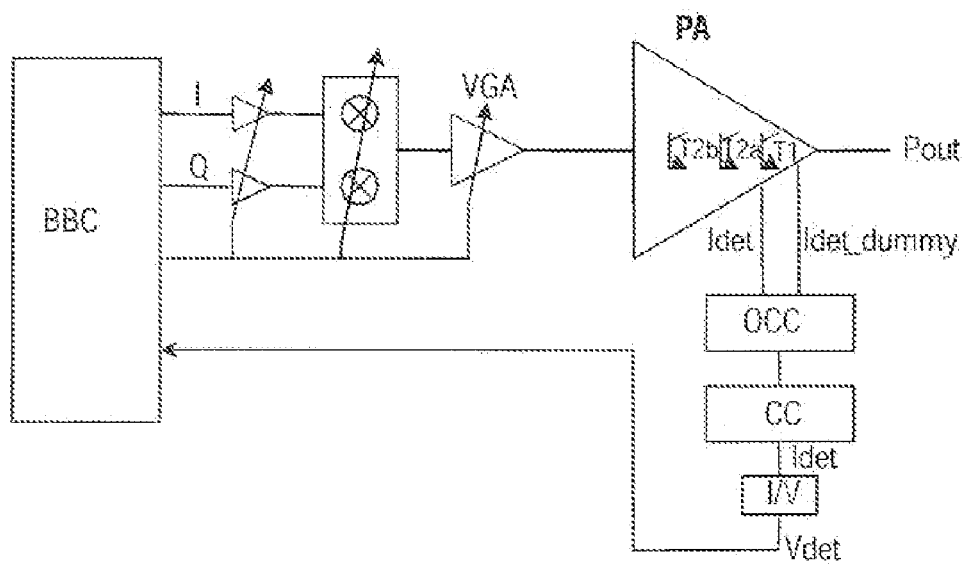
FIG. 16 shows a basic representation of a power amplifier with a power control loop according to a fifth embodiment of the invention.

FIG. 16 shows a basic representation of a power amplifier with a power control loop according to a fifth embodiment of the invention. This power control circuit is based on the circuit according to FIG. 14, i.e. a power control via baseband. Additionally, an offset compensation circuit OCC and a compression circuit CC is included into the power control loop.

The power amplifier according to FIGS. 15 and 16 may be implemented on the basis of the detection circuits according to FIGS. 1, 3, 4, 6, 9, and 12, but preferably according to FIGS. 9 and 12.

Figure 17:
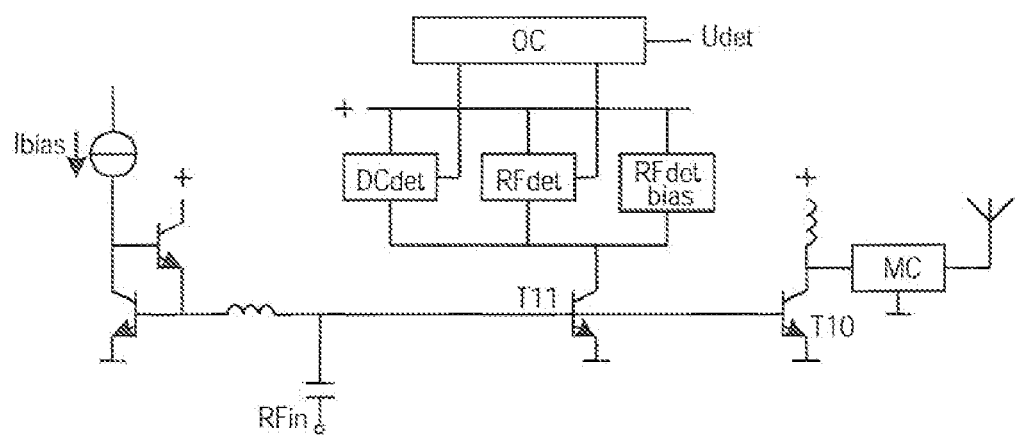
FIG. 17 shows a schematic block diagram of a detection circuit according to the sixth embodiment.

FIG. 17 shows a schematic block diagram of a detection circuit according to the sixth embodiment. The circuit is based on a current mirror T10, T11 with a collector current of T11 similar to that of the power transistor T10. The mirror collector T11 load contains a DC-detector DC-det, a RF detector RF-det and a circuit RF-det-bais for biasing for the RF-detector RF-det. The DC-detector DC-det and the RF detector RF-det are connected to a offset compensation circuit OC, which delivers $U_{det}$ as output, wherein $U_{det}$ is proportional to the output power of a power amplifier.

Figure 18:
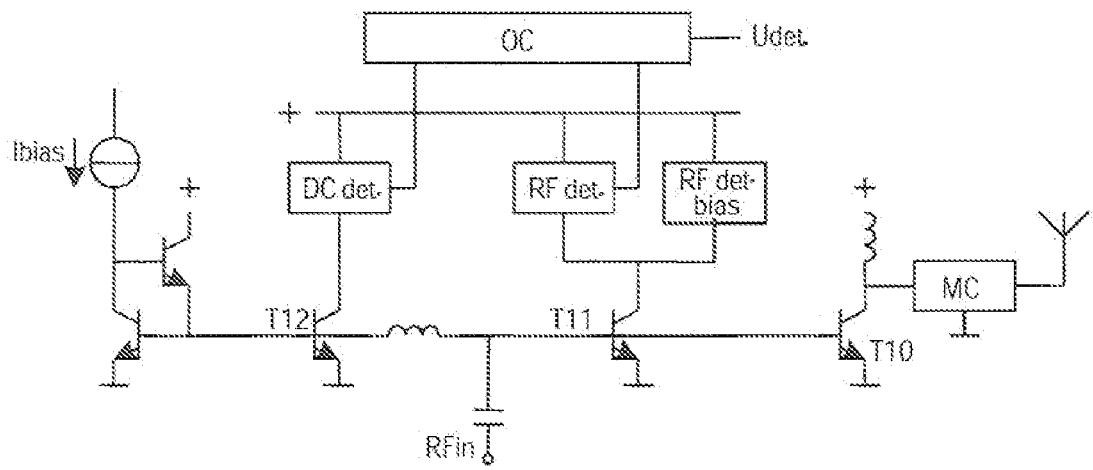
FIG. 18 shows a schematic block diagram of a detection circuit according to the seventh embodiment.

FIG. 18 shows a schematic block diagram of a detection circuit according to the seventh embodiment. This detection circuit is based on the detection circuit according to FIG. 17 and comprises a second mirror T12. The collector current of transistor T11 is similar to that of the power transistor T10. The other mirror transistor T12 is connected to a DC detector DC-det and has a DC-bias current similar to the DC-bias current of the power transistor T10. The DC-detector DC-det is fully RF separated from the RF-detector RF-det giving more circuit design freedom to optimise both independently. By implementing them on the same chip matching is guarantied. The RF isolation of the DC detector can be realised by means of a choke as well as with (base-ballasting) resisters. The offset compensation circuit OC is connected to the DC detector DC-det and the RF detector RF-det and delivers the detection voltage $U_{det}$ as output.

Figure 19:
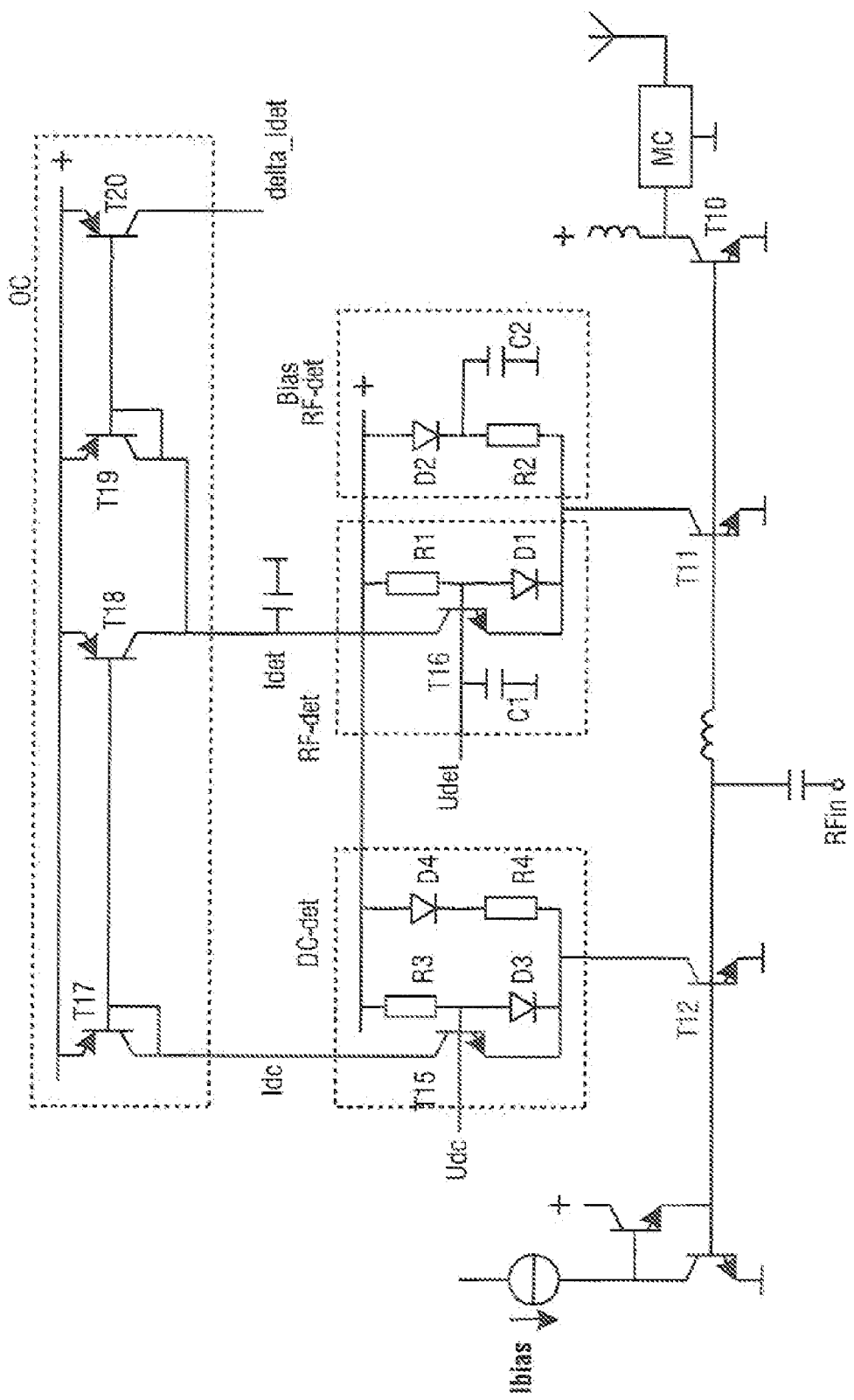
FIG. 19 shows the detector of FIG. 18 in more detail.

FIG. 19 shows the detector of FIG. 18 in more detail. The DC-detector DC-det and RF detector RF-det deliver output currents $I_{de}$ and $I_{det}$, respectively. The DC detector DC-det comprise a transistor T15 with its emitter coupled to the collector of mirror transistor T12, with its base coupled to the supply voltage via a resistor R3. A diode D3 is coupled between the base and the emitter of transistor T15. Furthermore, a diode D4 and a resistor R4 is coupled in series between the supply voltage and the collector of the mirror transistor T12. The collector of transistor T15 is coupled to the offset compensation circuit OC.

The RF detector RF-det comprises a transistor T16 with its collector coupled to the offset compensation circuit OC and its emitter coupled to the collector of mirror transistor T11. The base of transistor T16 is coupled to the supply voltage via resistor R1. A diode detector D1 is coupled between the base and the emitter of transistor T16. The base of transistor T16 provides the voltage $U_{det}$ and is furthermore coupled to ground via detector filter capacitor C1.

The bias RF detector bias-RF-det comprises a diode D2 and a resistor R2 coupled in series between the supply voltage and the collector of transistor T11, respectively. The connection between the diode D2 and the resistor R2 is coupled to ground via a capacitor C2.

The offset compensation circuit OC comprises four transistor T17, T18, T19, and T20. Transistors T17 and T18 as well as transistors T19 and T20 constitute two current mirrors, respectively. The base and the collector of transistor T17 and T19 are coupled to each other, respectively. The collector of transistor T17 is connected to the collector of transistor T15 in the DC detector and the collector of transistor T18 is connected to the collector of transistor T16 in the RF detector. The collector of transistor T20 supplies the current delta_Idet.

The RF current, which is flowing through the current mirror transistor T11, is detected by the RF detector RF-det, i.e. D1, C1 and R1, that is pre-biased by the RF-detector biasing circuit bias-RF-det, i.e. D2, R2 and C2. Due to symmetry in the circuit topology, the DC-biasing tracks accurately with the RF-detector over process spread, temperature etc. The DC-detector DC-det has the same topology as RF-detector RF-det and the biasing circuit bias-RF-det in order to provide a well matched DC-offset value. The RF isolation between the DC part and the RF part is provided with a choke L1 as typically used in silicon implementations not having base ballasting resistors.

Figure 20:
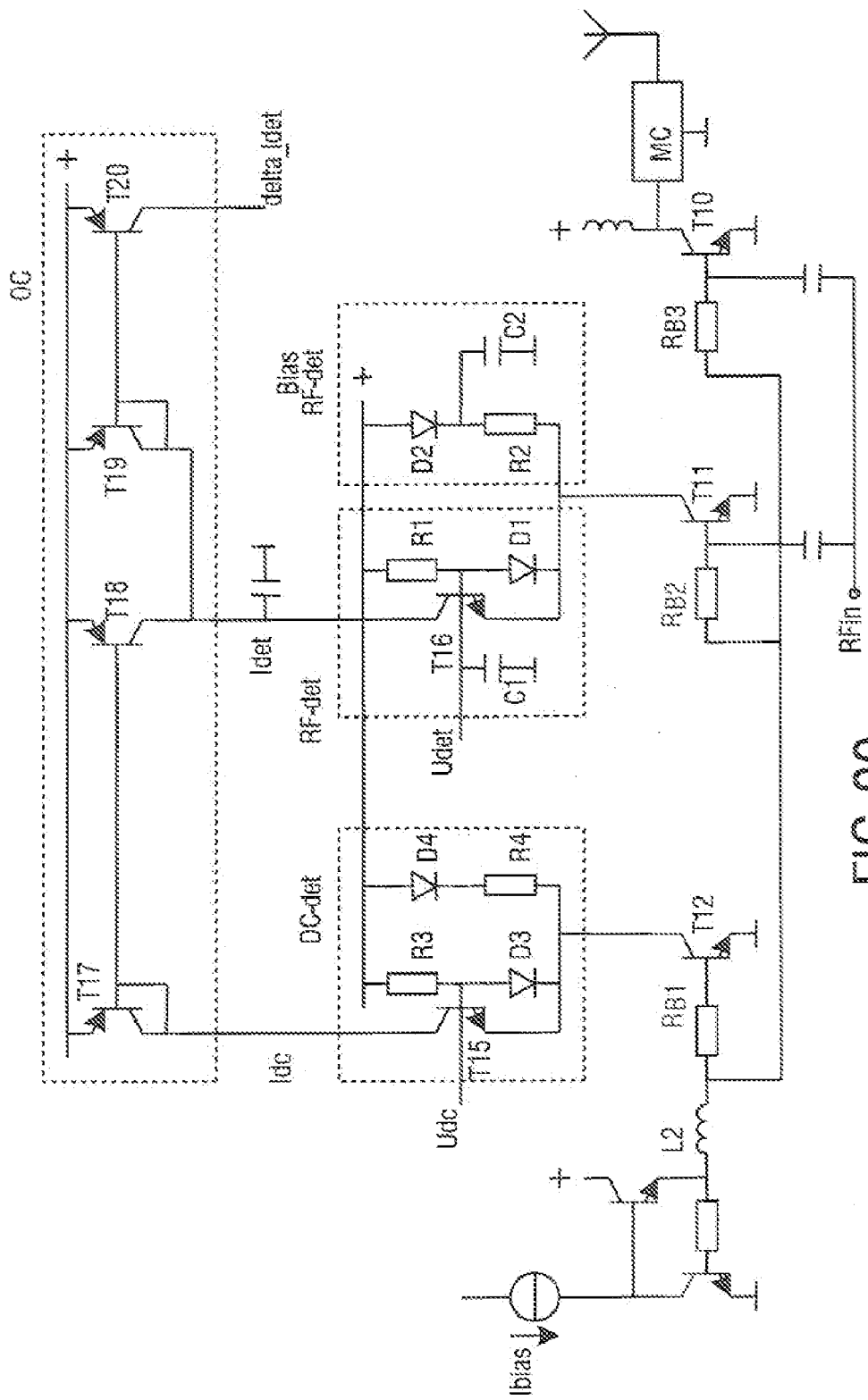
FIG. 20 shows the circuit diagram of a detector according to the eight embodiment.

FIG. 20 shows the circuit diagram of a detector according to the eight embodiment. This detector is based on the detector according to FIG. 19. The implementation of the offset compensation circuit OC, the DC detector DC-det, the RF detector RF-det and the biasing circuit bias-RF-det corresponds to the implementation of FIG. 19. However, the detector according to FIG. 31 is based on base-ballasting resistors $R_{B1}$, $R_{B2}$, and $R_{B2}$ with distributed DC-feeds and RF-feeds as often used in GaAs power amplifiers. The base-ballasting resistors $R_B$ provide RF-isolation to the current mirror transistor T12 with the DC-detector DC-det coupled to its collector.

Above, the detectors have been shown with two outputs each. A voltage output and a current output. According to the embodiments of the invention, the current outputs are fed to the offset compensation circuits. The voltage output are not used but could alternatively be fed to an op-amp like an offset subtraction circuit.

Figure 21:
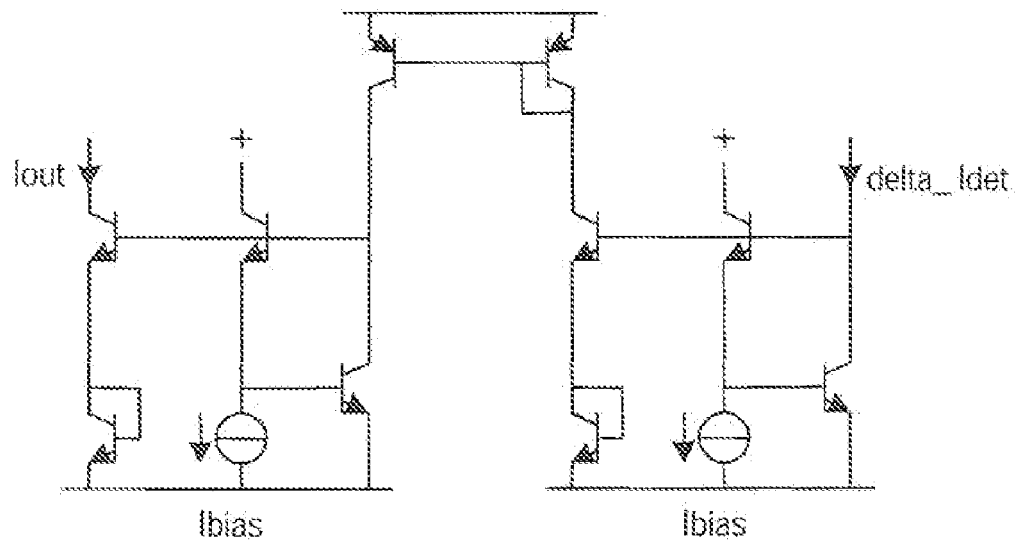
FIG. 21 shows the compression circuit CC of FIG. 16 embodied as a cascade of two square root circuits.

FIG. 21 shows the compression circuit CC of FIGS. 15 and 16 embodied as a square root circuit In particular, a two cascaded square root circuit are shown in FIG. 21. The square root function provides signal compression. It must be noted that in an alternative implementation several square root circuits can be cascaded to further increase the dynamic range of the power control loop PCL.

Figure 22:
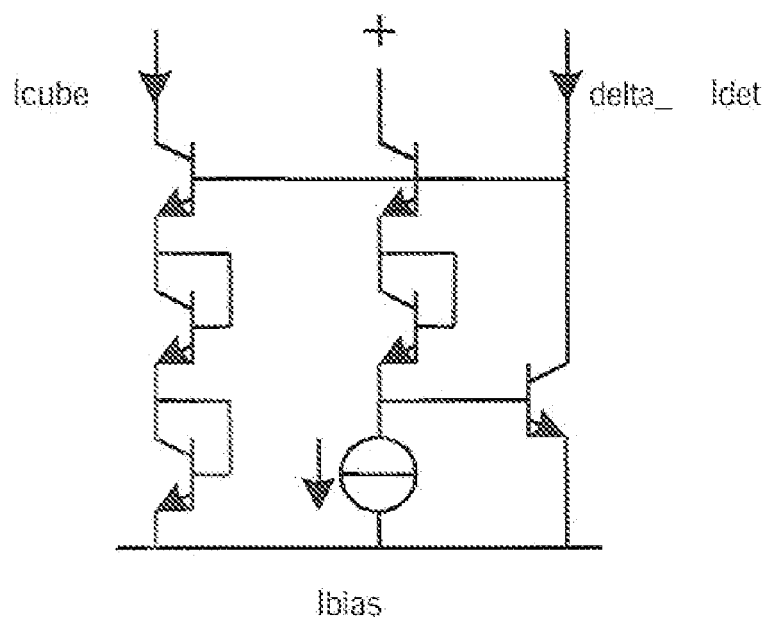
FIG. 22 shows an alternative implementation to the circuit of FIG. 17 forming a cube-root function.

FIG. 22 shows an alternative implementation the compression circuit CC of FIGS. 15 and 16 based on the circuit of FIG. 21. Additionally to the circuit of FIG. 21 two diode connected transistors are incorporated. This circuit is a cube root circuit implementing a cube root function that provides more compression than a square root function does.

The current thereof equals to:

$$I_{cube} = \sqrt[3]{delta\_Idet * I_{offset}^2}$$

Figure 23:
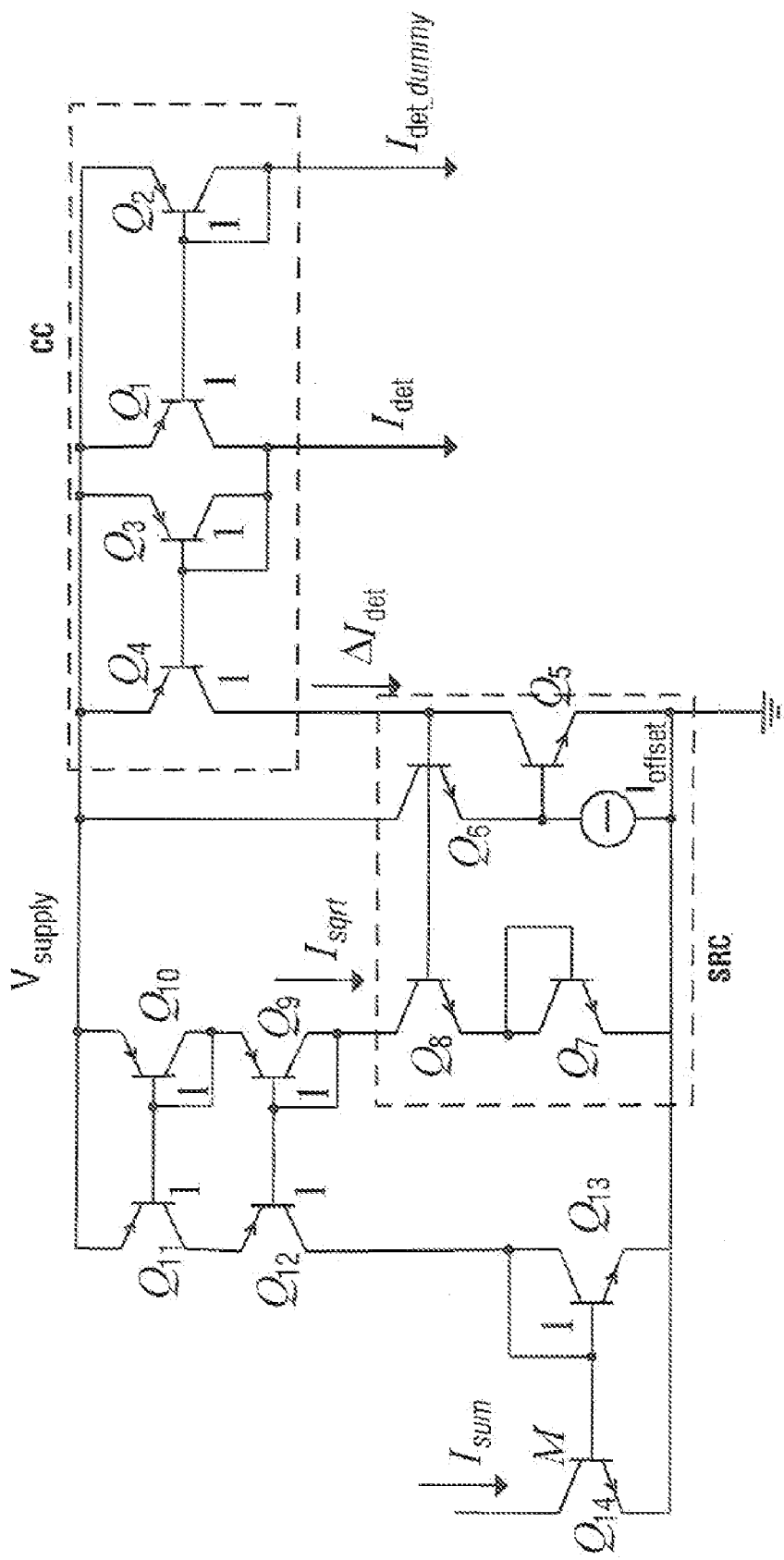
FIG. 23 shows an interface circuitry which is intended to perform a dc cancellation of the currents $I_{det}$ and $I_{det\_dummy}$ from the detection circuit of FIG. 12 followed by a square root signal compression circuit.
Figure 24:
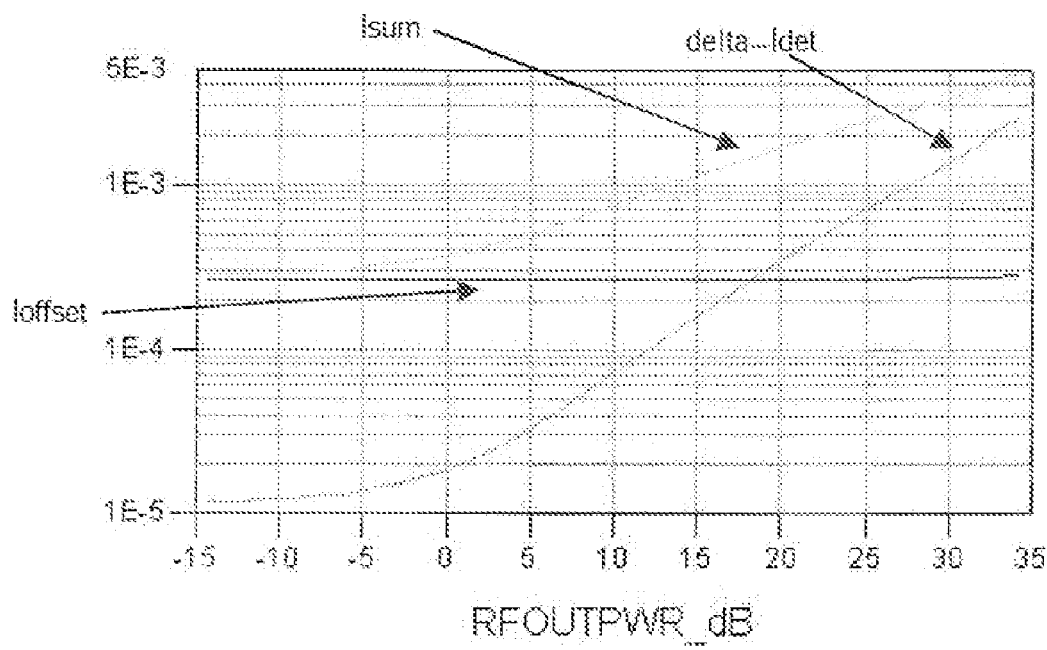
FIG. 24 shows simulated results of the currents $I_{sum}$, $I_{offset}$, and $\Delta I_{det}$ versus the output power.
Figure 25:
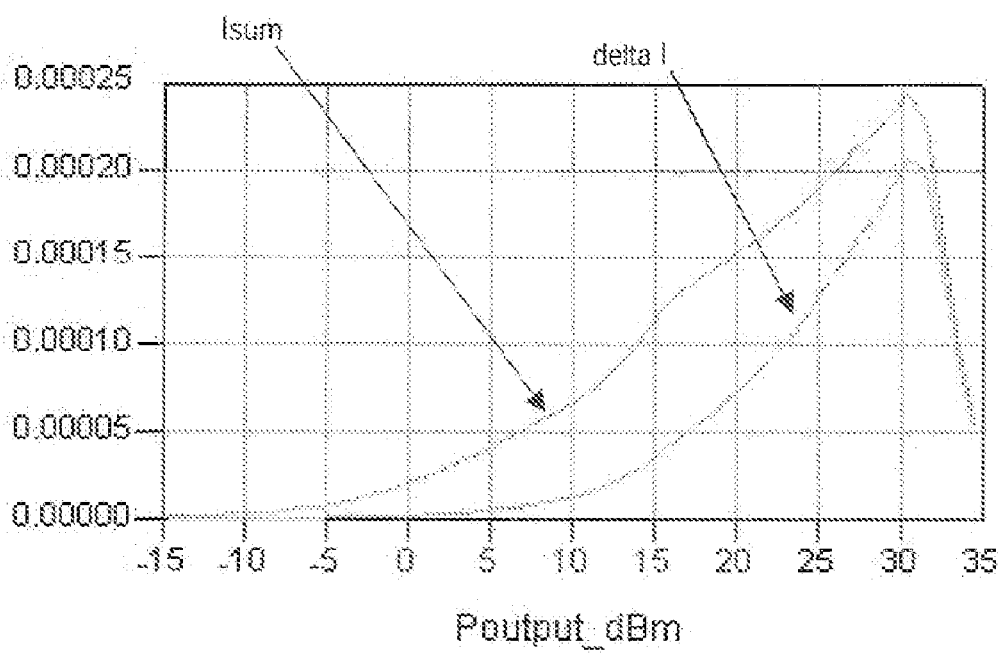
FIG. 25 shows the results of the currents $I_{sum}$ and $\Delta I_{det}$ versus output power.

FIG. 23 shows an interface circuitry which is intended to perform a dc cancellation of the currents $I_{det}$ and $I_{det\_dummy}$ from the detection circuit of FIG. 12. and to realize a square root function to increase sensitivity of the detected current. This circuit can be built up in the MMIC. The function of this circuit can be described as follows: The rectified current $I_{det}$ and dummy dc current $I_{det\_dummy}$ are cancelled by pnp transistors $Q_1$-$Q_4$ (scaled 1:1 ($Q_1$-$Q_2$ and $Q_3$-$Q_4$)), i.e. a cancellation circuit CC. As a result, output current $\Delta I_{det}$ is a accurate replica of the collector current of the power transistor $I_{C1}$ and does not depend on the quiescent current.

Further sensitivity increasing for the low output power level could be done by square root circuitry SRC, compromising of $Q_5$-$Q_8$, and realizing the function:

$$I_{sqrt} = \sqrt{\Delta I_{det}} \sqrt{I_{offset}} \sqrt{\frac{I_{S8} - I_{S7}}{I_{S5} I_{S6}}},$$

where $I_{S5}$, $I_{S6}$, $I_{S7}$, $I_{S8}$-saturation currents of $Q_5$-$Q_8$. Choosing their areas equal we have $I_{sqrt} = \sqrt{\Delta I_{det} I_{offset}}$ with the further mirroring of cascade connected $Q_9$-$Q_{12}$ and $Q_{13}$-$Q_{14}$ the output current results in $$I_{SUM} = MI_{sqrt} = M\sqrt{\Delta I_{det} I_{offset}} = M \sqrt{I_{offset} \frac{A_2}{A_1} \frac{R_{MT}}{R_{LD1}} NI_{C1}}.$$

Simulated results of the currents $I_{sum}$, $I_{offset}$, and $\Delta I_{det}$ versus the output power are shown in FIG. 17. The current $\Delta I_{det}$ corresponds to the detection result before applying the square root function and $I_{sum}$ to the results after applying the square root function.

As was mentioned before, a quite important aspect of the detector performance is the sensitivity. FIG. 18 shows the results of the currents $I_{sum}$ and $\Delta I_{det}$ versus output power. Accordingly, the square root function dramatically improves sensitivity $$\left(\frac{\delta I_{det}}{\delta P_{OUT}}\right)$$

of the detected current for low power levels (Isum-Diff-_Isum) vs (DeltaI-Diff_DeltaI).

Figure 26:
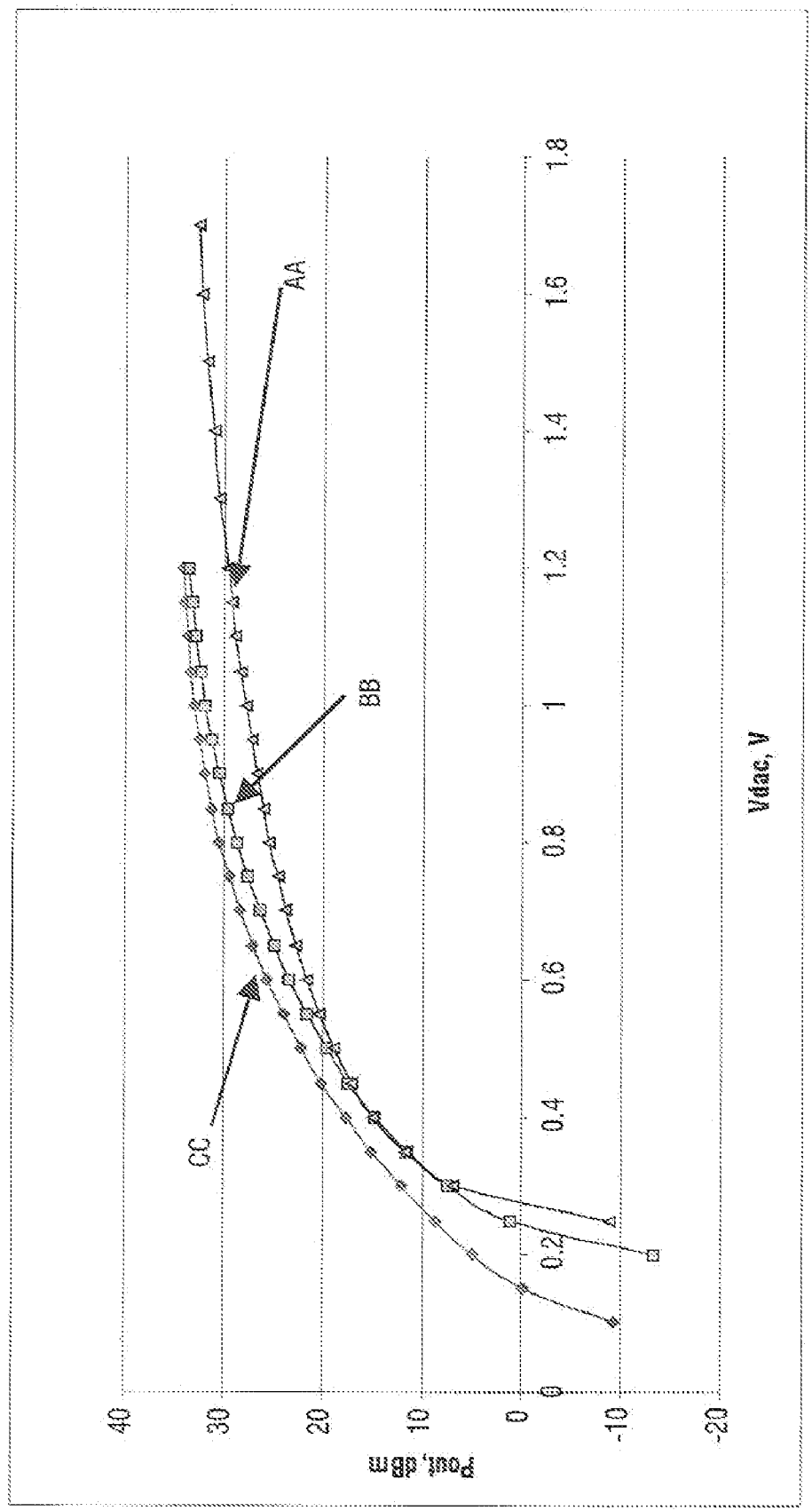
FIG. 26 shows differences in closed loop conditions of the circuits of FIG. 17 to 21.

FIG. 26 shows differences in closed loop conditions of the circuits of FIG. 17 to 21. The curve AA corresponds to the output power/voltage relation for power control loops according to the prior art. The curve BB represents the same relation for a power control loop with a compression circuit as shown in FIGS. 15 and 16. The curve CC represents the same relation for a power control loop with a compression circuit and an offset canceling circuit as shown in FIGS. 15 and 16. Accordingly, the sensitivity of the circuits with a compression circuit and a offset cancellation circuit is improved.

Another advantageous feature of this concept is less deviations due to Vsupply variations at the high power levels, compared with average current detection (IMT_dc). This effect is explained again by the square root behavior, i.e. higher slope for the low output power and saturation effect for the high output power.

DC cancellation in combination with the square root circuit is improving the slope and deviations of the output power: DC cancellation cancels the inaccuracy of the power detector and improves sensitivity at low power levels The square root circuit further improves sensitivity at low power levels and makes use of a "saturation effect" at high levels (similar to that in the voltage domain with log amps, but using less transistors and more easily cascadable. This combination allows a safe choice of gain and BW for the power control loop in order to avoid oscillations (under mismatch conditions).

It should be noted that the power amplifier circuit may be used in various applications, such as audio amplification, or RF amplification in such areas as wireless communication and internet connection.

It should be further noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Detection circuit for detecting the output power of a power amplifier, comprising:
    a first current mirror transistor (T11) having a base, which is connectable to a power transistor (T10), and a collector;
    a RF detection means (RF-det) for detecting the RF current flowing through the current mirror transistor (T11), wherein said RF detection means (RF-det) is connected to the collector of said first current mirror transistor (T11), and
    a biasing means (bias-RE-det) for biasing said RF detection means (RE-det), wherein said biasing means is connected to said collector of said first current mirror (T11) and said RF detection means (RF-det).

2. Detection circuit according to claim 1, further comprising a DC detector (DC-det) for detecting the DC components of the current flowing through said first current mirror transistor (T11), wherein said DC detector (DC-det) is connected to said collector of said first current mirror transistor (T11).

3. Detection circuit according to claim 1, further comprising:
    a second current mirror transistor (T12) having a base which is connectable to a power transistor (T10), and
    a DC detector (DC-det) for detecting the DC components of the current flowing through said second current mirror transistor (T12), wherein said DC detector (DC-det) is connected to said collector of said second current mirror transistor (T11).

4. Detection circuit according to claim 3, further comprising a RF isolation means (L) connected between the first and second current mirror transistor (T11, T12).

5. Detection circuit according to claim 3 4, wherein the detection circuit is implemented on the same chip.

* * * * *